United States Patent
Risch et al.

(10) Patent No.: US 6,864,129 B2
(45) Date of Patent: Mar. 8, 2005

(54) DOUBLE GATE MOSFET TRANSISTOR AND METHOD FOR THE PRODUCTION THEREOF

(75) Inventors: Lothar Risch, Neubiberg (DE); Wolfgang Rösner, Ottobrunn (DE); Thomas Schulz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/996,279

(22) Filed: Nov. 28, 2001

(65) Prior Publication Data

US 2002/0081791 A1 Jun. 27, 2002

Related U.S. Application Data

(63) Continuation of application No. PCT/DE00/01714, filed on May 26, 2000.

(30) Foreign Application Priority Data

May 28, 1999 (DE) .......................................... 199 24 571

(51) Int. Cl.[7] ........................ H01L 21/00; H01L 21/336; H01L 27/01
(52) U.S. Cl. ........................ 438/157; 438/257; 438/269; 438/283; 438/300; 257/347
(58) Field of Search ............................ 438/283, 157, 438/300, 269, 257; 257/347

(56) References Cited

U.S. PATENT DOCUMENTS

| | | | |
|---|---|---|---|
| 5,072,276 A | * 12/1991 | Malhi et al. .................. | 257/328 |
| 5,120,666 A | 6/1992 | Gotou | |
| 5,461,250 A | * 10/1995 | Burghartz et al. ........... | 257/192 |
| 5,604,368 A | * 2/1997 | Taur et al. ................... | 257/348 |
| 5,646,058 A | 7/1997 | Taur et al. | |
| 5,753,541 A | * 5/1998 | Shimizu ....................... | 438/161 |
| 5,965,914 A | * 10/1999 | Miyamoto .................... | 257/331 |
| 6,004,837 A | * 12/1999 | Gambino et al. ............ | 438/157 |
| 6,207,530 B1 | * 3/2001 | Hsu et al. .................... | 438/158 |
| 6,316,296 B1 | * 11/2001 | Sakamoto .................... | 438/151 |
| 6,365,465 B1 | * 4/2002 | Chan et al. .................. | 438/157 |
| 6,413,802 B1 | * 7/2002 | Hu et al. ...................... | 438/151 |

FOREIGN PATENT DOCUMENTS

| | | |
|---|---|---|
| DE | 44 33 086 C2 | 3/1995 |
| DE | 198 03 479 A1 | 12/1998 |
| EP | 0 612 103 A2 | 8/1994 |
| EP | 0 704 909 A2 | 4/1996 |

OTHER PUBLICATIONS

Colinge, J.P. et al.: "Silicon–On–Insulator 'Gate–All–Around Device'", IEDM 1990, pp. 595–598.

Wong, Hon–Sum Philip et al.: "Self–Aligned (Top and Bottom) Double–Gate MOSFET with a 25 nm Thick Silicom Channel", IEDM 1997, pp. 427–430.

Pikus, F.G. et al.: "Nanoscale field–effect transistors: An ultimate size analysis", Appl. Phys. Lett. 1971, vol. 25, Dec. 22, 1997, pp. 3661–3663.

* cited by examiner

*Primary Examiner*—Long Pham
*Assistant Examiner*—Shrinivas Rao
(74) *Attorney, Agent, or Firm*—Laurence A. Greenberg; Werner H. Stemer; Gregory L. Mayback

(57) ABSTRACT

A double gate MOSFET transistor and a method for fabricating it are described. In this case, a semiconductor layer structure of a transistor channel to be formed is embedded in a spacer material and contact-connected by source and drain regions which are filled into depressions that are etched on opposite sides of the semiconductor layer structure. Afterwards, the spacer material is etched out selectively and replaced by the electrically conductive gate electrode material.

20 Claims, 3 Drawing Sheets

——— Semiconductor Layer Structure
- - - - Structure of the Spacer Layers
—··— Etched Depression
— — — Contact Hole

DOUBLE GATE MOSFET TRANSISTOR AND METHOD FOR THE PRODUCTION THEREOF

CROSS-REFERENCE TO RELATED APPLICATION

This application is a continuation of copending International Application PCT/DE00/01714, filed May 26, 2000, which designated the United States.

BACKGROUND OF THE INVENTION

Field of the Invention

The invention relates to a method for fabricating a double gate MOSFET transistor and to a double gate MOSFET transistor.

The advancing miniaturization of bulk MOS transistors will encounter its limits in the foreseeable future as a result of the known short-channel effects. However, the principle of the MOS transistor can still continue to be utilized down to channel lengths of 10 nm or even less than that. The precondition is the most extensive possible punch-through of the gate potential through the entire channel region, which is best achieved in so-called double gate MOSFETs in conjunction with a very thin silicon region, as has been shown in the publication by F. G. Pikus et al. in Appl. Phys. Lett. 71, 3661 (1997).

Such transistors have only been able to be realized on a laboratory scale heretofore. Thus, J. P. Colinge et al. proposed, in IEDM 90-595, a method in which, on an silicon on insulator (SIO) substrate, the oxide is removed wet chemically in the region below the transistor channel and the space is later filled with the polysilicon of the rear side gate. However, the method has the disadvantage that the etching cannot be restricted to a small region and, what is more, there is no self-alignment with the top-side gate, which adversely effects the electrical properties.

Furthermore, the reference by H.-S. P. Wong et al., in IEDM 97-427, discloses a process in which the thin silicon channel region is produced by epitaxial growth through a correspondingly thin tunnel. The process appears to be extremely technologically demanding, however.

U.S. Pat. No. 5,646,058 describes a double gate MOSFET transistor and a method for fabricating it. The transistor has a web-type channel region that is disposed between a source region and a drain region and, at its two horizontal sides is covered by a gate electrode and a gate oxide lying in between.

In Published, Non-Prosecuted German Patent Application DE 198 03 479 A1, which forms the generic type for the device claim, and the prior art disclosed therein in FIGS. 49–51, thin-film transistors are described which are formed above a substrate and an insulation layer and in which at least one channel, formed as a web between a source region and a drain region, is completely embedded by a gate region and gate oxide layers lying in between.

SUMMARY OF THE INVENTION

It is accordingly an object of the invention to provide a double gate MOSFET transistor and a method for the production thereof which overcomes the above-mentioned disadvantages of the prior art methods and devices of this general type, which results in the most accurate possible alignment of the top-side and underside gates and, is technologically not too complex and difficult.

With the foregoing and other objects in view there is provided, in accordance with the invention, a method for fabricating a double gate MOSFET. The method includes providing a substrate structure having a silicon substrate layer, a first insulation layer disposed on the silicon substrate layer, a first spacer or separation layer disposed on the first insulation layer, and a semiconductor layer disposed on the first spacer layer. The semiconductor layer is patterned resulting in a semiconductor layer structure provided as a channel of the double gate MOSFET. A second spacer or separation layer is deposited on the semiconductor layer structure and the first spacer layer. The first and second spacer layers are patterned such that the semiconductor layer structure remains substantially completely embedded in the first and second spacer layers. A second insulation layer is deposited on a structure formed of the first and second spacer layers. Two depressions disposed along one direction are vertically etched, the two depressions are dimensioned such that the semiconductor layer structure is situated completely between them. During the etching of the two depressions, the second insulation layer, the first and second spacer layers and, in each case on both sides, an edge section of the semiconductor layer structure are etched through completely in each case. The depressions are filled with an electrically conductive material. A contact hole is formed in the second insulation layer. The first and second spacer layers are selectively removed through the contact hole made in the second insulation layer. Third insulation layers are applied on inner walls of a region of removed spacer layers and on surfaces of the semiconductor layer structure. A further electrically conductive material is introduced into the region of the removed spacer layers.

Accordingly, the basic principle of the fabrication process according to the invention relates to embedding the semiconductor material of the transistor channel to be formed in a spacer material which is etched out selectively in the course of the process and replaced by the electrically conductive gate electrode material. The channel length is defined by an etching step by which the semiconductor layer, that is to say the channel region, and the spacer material are etched using one and the same mask.

In accordance with an added mode of the invention, there is the step of forming the substrate structure by applying the first insulation layer, the first spacer layer, and the semiconductor layer one after another.

In accordance with an additional mode of the invention, there is the step of recrystallizing the semiconductor layer after being applied by being irradiated with a laser beam.

In accordance with another mode of the invention, the substrate structure is formed by the steps of: providing the silicon substrate functioning as a first semiconductor substrate; applying the first insulation layer on the first semiconductor substrate; providing a second semiconductor substrate; applying the first spacer layer on the second semiconductor substrate; connecting the first and second semiconductor substrates to one another using a wafer bonding process between the insulation layer and the first spacer layer; and reducing a thickness of the second semiconductor substrate resulting in the semiconductor layer.

In accordance with a further mode of the invention, there is the step of forming the first and second spacer layers from silicon nitride.

In accordance with another added mode of the invention, there is the step of planarizing the second insulation layer after being deposited.

In accordance with another additional mode of the invention, there is the step of carrying out the step of selectively removing the first and second spacer layers through the contact hole made in the second insulation layer.

In accordance with another further mode of the invention, there are the steps of forming the electrically conductive material from doped polycrystalline silicon, metal or silicide and forming the doped polycrystalline silicon by chemical vapor phase deposition and the doping is performed during the deposition.

In accordance with an added mode of the invention, there is the step of using a selectively acting, wet-chemical etching step for removing the first and second spacer layers.

In accordance with another mode of the invention, there is the step of applying the third insulation layers using a thermal oxidation process.

In accordance with an additional mode of the invention, there is the step of producing a relatively thin oxide layer on the surface of the semiconductor layer structure and producing a relatively thick oxide layer on the inner walls of the region of the removed spacer layers.

In accordance with another mode of the invention, there are the steps of forming the further electrically conductive material from doped polycrystalline silicon, metal or silicide; and forming the doped polycrystalline silicon by chemical vapor phase deposition and a doping is performed during the chemical vapor phase deposition.

In accordance with a further mode of the invention, there are the steps applying an oxide layer as the first insulation layer, applying a silicon layer as the semiconductor layer, depositing an oxide layer as the second insulation layer, and applying oxide layers as the third insulation layers.

In accordance with a concomitant mode of the invention, there is the step of using arsenic atoms or phosphorous atoms in the doping process.

With the foregoing and other objects in view there is provided, in accordance with the invention, a double gate MOSFET. The MOSFET includes a substrate, a first insulation layer disposed on the substrate, a semiconductor layer structure having horizontal surfaces and vertical surfaces, and a gate electrode disposed on the first insulation layer. The gate electrode completely surrounds the horizontal surfaces of the semiconductor layer structure, and the semiconductor layer structure is embedded in the gate electrode. A source region is disposed on the first insulation layer. A drain region is disposed on the first insulation layer, the source region and the drain region are disposed on opposite sides of the semiconductor layer structure and of the gate electrode, the source region and the drain region are contact-connected to the vertical surfaces of the semiconductor layer structure. A second insulation layer is disposed on the first insulation layer and the gate electrode. The second insulation layer has a contact hole formed therein for making contact with the gate electrode in a region of the gate electrode at a lateral distance from the semiconductor layer structure. Third insulation layers are disposed on the gate electrode, the source region and the drain region.

In accordance with an added feature of the invention, the gate electrode, the source region, and/or the drain region is formed from doped polycrystalline silicon, metal or silicide.

Other features which are considered as characteristic for the invention are set forth in the appended claims.

Although the invention is illustrated and described herein as embodied in a double gate MOSFET transistor and a method for the production thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
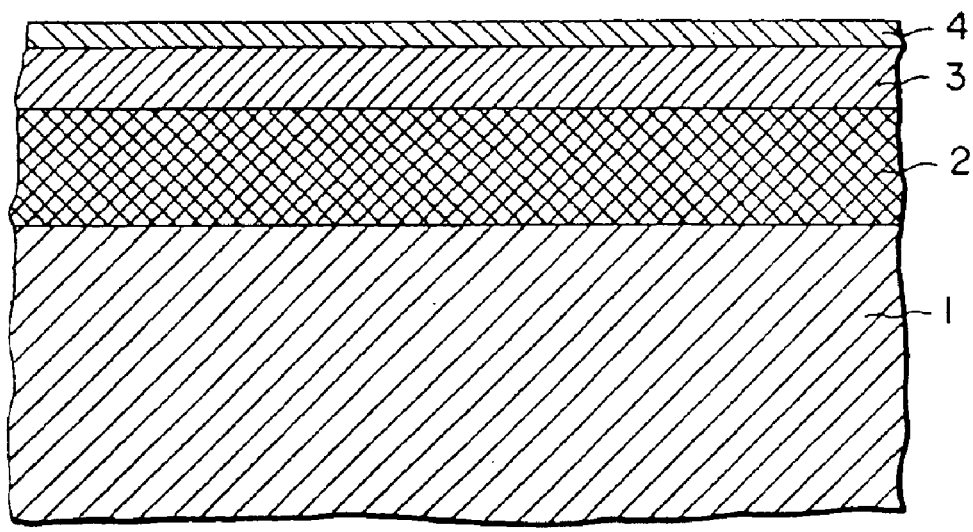
FIG. 2 is a cross-sectional view taken along the line II—II after an application of a silicon layer provided for a transistor channel.

Referring now to the figures of the drawing in detail and first, particularly, to FIG. 2 thereof, there is shown a so-called silicon on insulator (SOI) starting substrate containing a substrate 1, such as an silicon wafer, to which are subsequently applied a first oxide layer 2, a first spacer layer 3 made of silicon nitride (SiN) and a semiconductor layer 4 being a silicon layer in the present case. Such a starting substrate can be fabricated by wafer bonding, for example, in that, separately from one another, an oxide layer is grown on a first silicon wafer and a nitride layer is grown on a second silicon wafer and the two silicon wafers are fixed to one another at the oxide and nitride layers by a wafer bonding method known per se in the prior art. Afterwards, during the process, the second silicon wafer has to be brought to the desired thickness by polishing and/or etching. As an alternative to the fabrication process, the structure shown in FIG. 2 can also be obtained by successive deposition of the layer construction shown and by subsequent recrystallization, for example laser recrystallization of the silicon grown in polycrystalline form. However, it is also theoretically conceivable to leave the semiconductor layer 4 in the polycrystalline state with a small crystallite size or even in the amorphous state. Although the mobility is restricted to a relatively great extent in this state, the small volume of the channel region and the complete punch-through of the gate potential nonetheless give rise to the prospect of a feasible power of the component even in that case. During fabrication, the complex recrystallization method could then be dispensed with.

Figure 1:
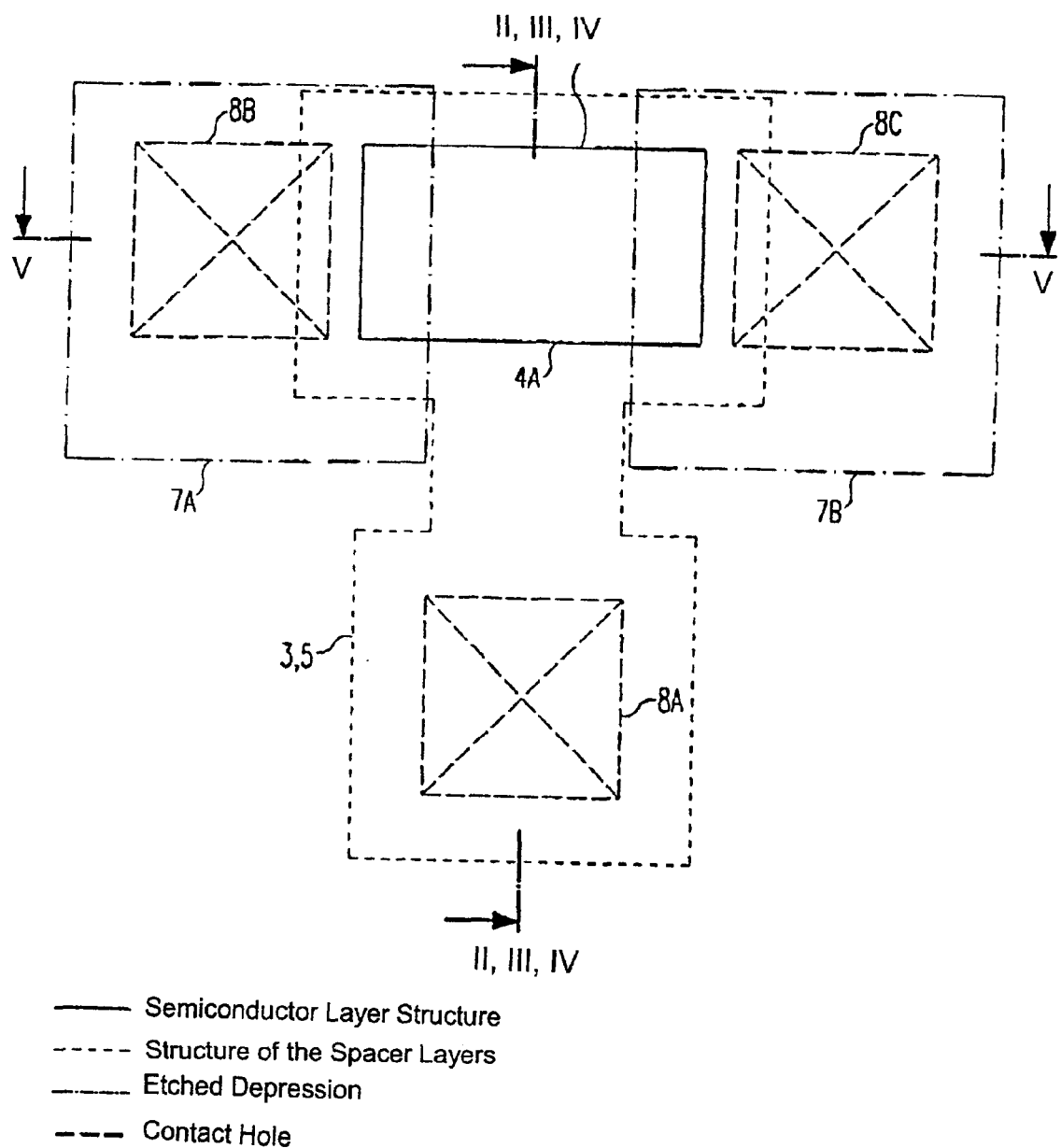
FIG. 1 is a diagrammatic, plan view of geometric ratios of regions to be processed during a fabrication process according to the invention.

Afterwards, the silicon layer 4 is patterned by a suitable method to leave a semiconductor layer structure 4A (FIG. 3), a rectangular region in the present case, as is shown by the solid line in FIG. 1.

Figure 3:
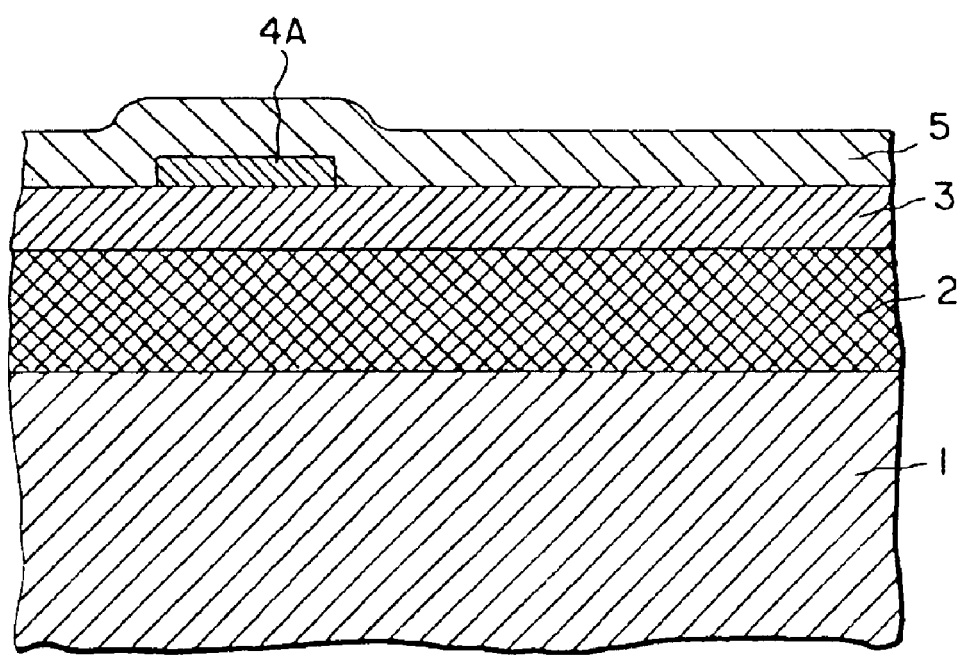
FIG. 3 is a cross-sectional view taken along the line III—III after a patterning of the silicon layer and an application of a second nitride layer.

The rectangular region 4A is subsequently covered by a second spacer layer 5 made of SiN, with the result that it is completely enclosed by the SiN material, as is illustrated in FIG. 3. As will become evident further below, the SiN material serves as a spacer material for a gate electrode that is to be used in its place.

Figure 4:
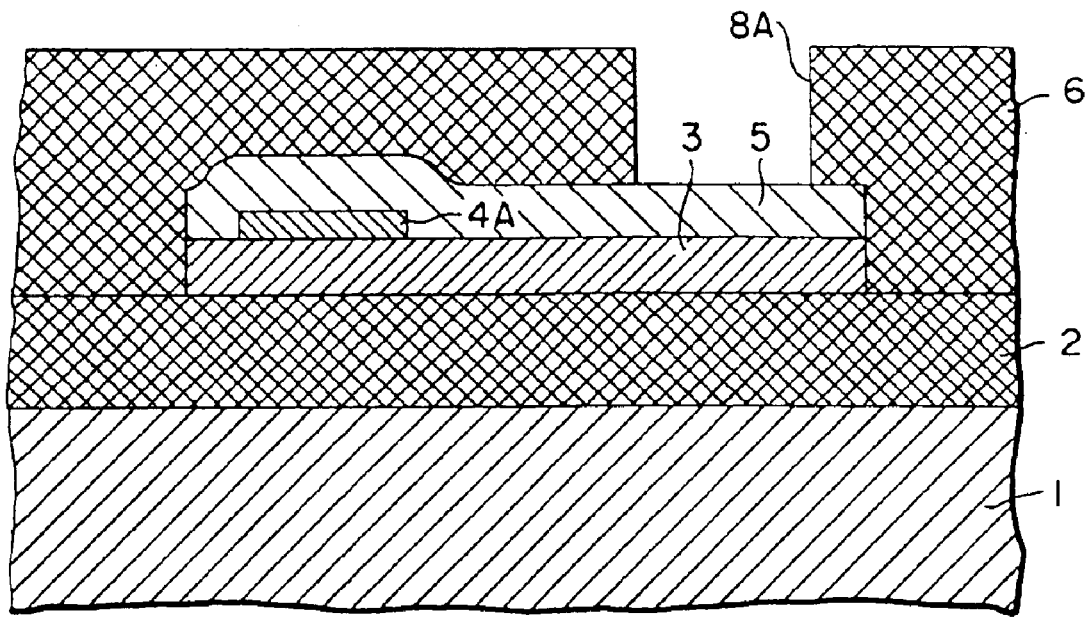
FIG. 4 is a cross-sectional view taken along the line IV—IV after an application of a second oxide layer and etching of a contact hole.

The spacer layers 3 and 5 are subsequently patterned by a suitable method in such a way that a region thereof remains, as is shown by the broken line in FIG. 1 and as shown in FIG. 4. The region has essentially two rectangular sections that are connected to one another by a web. The upper rectangular region in the illustration in FIG. 1 contains the embedded semiconductor layer structure. Outside the region of the broken line in FIG. 1, the first oxide layer 2 is situated at the surface.

A second oxide layer 6 is then deposited onto the structure and its surface is subsequently planarized, as can be seen in FIG. 4. The planarization may be effected by chemical mechanical polishing, for example.

Figure 5:
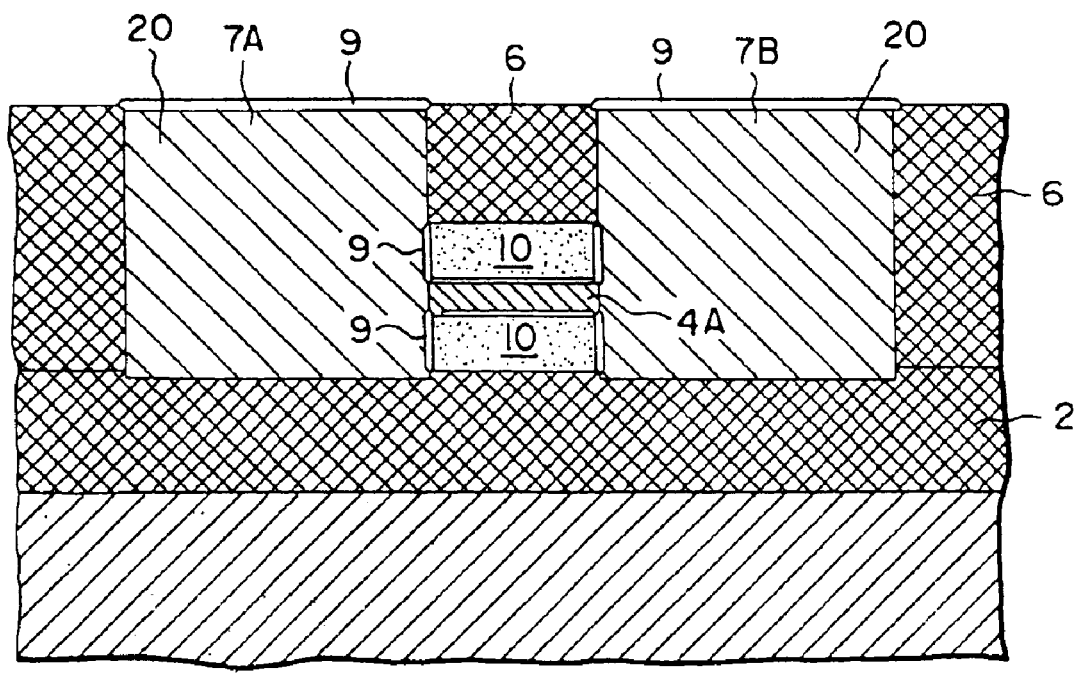
FIG. 5 is a cross-sectional view taken along the line V—V of the double gate MOSFET.

Afterwards, in the dash-dotted regions in FIG. 1, vertical depressions 7A, 7B are etched into the structure. For each of the depressions 7A, 7B, the first and second spacer layers 3, 5 and, in each case on both sides, an edge section of the semiconductor layer structure 4A being etched through completely in each case, as can be seen in FIG. 5. In the plan view of FIG. 1, the dashed-dotted regions to be etched lie opposite one another on the short sides of the rectangular silicon region 4A, a slight overlap with the rectangular silicon region existing on both sides. During the etching, then, the rectangular silicon region 4A is incipiently etched in both depressions 7A, 7B. In the etched depressions, then, the respective ends of the silicon region 4A are uncovered at respective inner walls. As can furthermore be discerned in FIG. 5, the nitride layers 3, 5 and the silicon layer 4 are etched through completely into their depth, with the result that the oxide layer 2 is slightly incipiently etched at the surface. The oxide layer 2 can also be used as an etching stop layer for the etching operation.

Source and drain regions are subsequently fabricated in the depressions 7A, 7B by filling the depressions with electrically conductive material 20. The material 20 may be, for example, highly doped polysilicon, a metal or a metal silicide. The material 20 must be deposited slowly, so that the depressions 7A, 7B are filled to an appreciable extent before the opening grows over. After the method step, the source and drain regions 20 are thus in contact with the silicon region 4A on both sides. In this case, too, the surface is subsequently planarized, which can be carried out for example by etching back or chemical mechanical polishing.

A first contact hole 8A is then made in the oxide layer 6 in the region of the lower rectangular section of the nitride layers (see FIG. 1). The result is shown in FIG. 4 in a cross-sectional view along the line IV—IV in FIG. 1. Afterwards, the spacer silicon nitride layers 3, 5 are etched out selectively, for example wet-chemically through the contact hole 8A. The result obtained is a structure in which a freely suspended silicon web (reference symbol 4A), provided as the channel region of the transistor to be fabricated, is held only at its ends by the source and drain regions 20, as shown in FIG. 5.

Afterwards, insulation layers 9 are formed by thermal oxidation, for example. In this case, a relatively thin gate oxide forms on the silicon web 4A and, in the case where doped polycrystalline silicon is used for the source and drain regions 20, a thicker thermal oxide simultaneously forms on the source and drain regions 20, as can be discerned in FIG. 5, on account of the increase in the oxide growth rate with the degree of doping. Consequently, a relatively thick thermal oxide is also formed on the surface of the source and drain regions 20.

A gate electrode 10 is then formed in the etched-free regions in which the spacer silicon nitride layers 3, 5 were previously situated. This is preferably done by chemical vapor phase (CMP) deposition of highly doped polysilicon, followed by planarization of the surface of the structure. The doping is effected in situ in this case, that is to say during the deposition, and the doping material is phosphorus, for example, which makes the semiconductor n-conducting. However, a metal or a metal silicide may also be deposited as gate electrode. Afterwards, the surface is again planarized by etching back or chemical mechanical polishing.

By virtue of the fact that the etching of the depressions 7A, 7B is carried out using one and the same mask, the channel length and the position of the gate electrodes are thus defined simultaneously, as a result of which the gate electrodes are aligned very accurately with one another.

In the state of the component as shown in FIG. 5, the source and drain regions 20 are not yet provided with metal contacts. Accordingly, contact holes 8B, 8C are finally also made in the oxide layers of the source and drain regions 20, as shown by the dotted lines in FIG. 1. The contact holes 8B, 8C are finally metallized, source and drain contacts thereby being fabricated.

We claim:

1. A method for fabricating a double gate MOSFET, which comprises the steps in the following sequence:
    producing gates aligned accurately with one another by;
    providing a substrate structure having a silicon substrate layer, a first insulation layer disposed on the silicon substrate layer, a first separation layer disposed on the first insulation layer, and a semiconductor layer disposed on the first separation layer;
    patterning the semiconductor layer resulting in a semiconductor layer structure provided as a channel of the double gate MOSFET;
    depositing a second separation layer on the semiconductor layer structure and the first separation layer;
    completely embedding the semiconductor layer structure in the first and second separation layers by patterning the first and second separation layers;
    depositing a second insulation layer on a structure formed of the first and second separation layer;
    vertically etching two depressions disposed along one direction, the two depressions dimensioned such that the semiconductor layer structure is situated completely between them, during the etching of the two depressions, the second insulation layer, the first and second separation layers and, in each case on both sides, an edge section of the semiconductor layer structure being etched through completely in each case;
    filling the depressions with an electrically conductive material;
    forming a contact hole in the second insulation layer;
    removing a region of the separation layers extending from the contact hole to the semiconductor layer structure and in which region the semiconductor layer structure is embedded in the separation layers by etching the region of the separation layers through the contact hole;
    applying third insulation layers on inner walls of the region of removed separation layers and on surfaces of the semiconductor layer structure; and
    introducing a further electrically conductive material into the region of the removed separation layers.

2. The method according to claim 1, which comprises forming the substrate structure by applying the first insulation layer, the first separation layer, and the semiconductor layer one after another.

3. The method according to claim 2, which comprises recrystallizing the semiconductor layer after being applied by being irradiated with a laser beam.

4. The method according to claim 1, which comprises forming the substrate structure by the steps of:
- providing the silicon substrate functioning as a first semiconductor substrate;
- applying the first insulation layer on the first semiconductor substrate;
- providing a second semiconductor substrate;
- applying the first separation layer on the second semiconductor substrate;
- connecting the first and second semiconductor substrates to one another using a wafer bonding process between the insulation layer and the first separation layer; and
- reducing a thickness of the second semiconductor substrate resulting in the semiconductor layer.

5. The method according to claim 1, which comprises forming the first and second separation layers from silicon nitride.

6. The method according to claim 1, which comprises planarizing the second insulation layer after being deposited.

7. The method according to claim 1, which comprises carrying out the step of selectively removing the first and second separation layers through the contact hole made in the second insulation layer.

8. The method according to claim 1, which comprises forming the electrically conductive material from a material selected from the group consisting of doped polycrystalline silicon, metal and suicide.

9. The method according to claim 8, which comprises forming the doped polycrystalline silicon by chemical vapor phase deposition and a doping is performed during the deposition.

10. The method according to claim 1, which comprises selectively removing the first and second separation layers by wet-chemical etching.

11. The method according to claim 1, which comprises applying the third insulation layers using a thermal oxidation process.

12. The method according to claim 11, which comprises producing a relatively thin oxide layer on
- the surface of the semiconductor layer structure and producing a relatively thick oxide layer on the inner walls of the region of the removed separation layers.

13. The method according to claim 1, which comprises forming the further electrically conductive material from a material selected from the group consisting of doped polycrystalline silicon, metal and silicide.

14. The method according to claim 13, which comprises forming the doped polycrystalline silicon by chemical vapor phase deposition and a doping is performed during the chemical vapor phase deposition.

15. The method according to claim 1, which comprises applying an oxide layer as the first insulation layer.

16. The method according to claim 1, which comprises applying a silicon layer as the semiconductor layer.

17. The method according to claim 1, which comprises depositing an oxide layer as the second insulation layer.

18. The method according to claim 1, which comprises applying oxide layers as the third insulation layers.

19. The method according to claim 9, which comprises using arsenic atoms in the doping process.

20. The method according to claim 14, which comprises using phosphorous atoms in the doping process.

* * * * *